United States Patent [19]

Cordani

[11] Patent Number: 5,234,542
[45] Date of Patent: Aug. 10, 1993

[54] COMPOSITION AND PROCESS FOR STRIPPING TIN FROM COPPER SURFACES

[75] Inventor: John L. Cordani, Waterbury, Conn.

[73] Assignee: MacDermid, Incorporated, Waterbury, Conn.

[21] Appl. No.: 847,681

[22] Filed: Mar. 4, 1992

[51] Int. Cl.$^5$ ............................................. C23G 1/02
[52] U.S. Cl. ................................. 156/656; 156/664; 252/79.2; 134/3; 134/41
[58] Field of Search .............. 156/656, 664; 252/79.2; 134/2, 41, 3

[56] References Cited

U.S. PATENT DOCUMENTS

| | | | |
|---|---|---|---|
| H284 | 6/1987 | Wegman et al. | 156/656 X |
| 3,660,253 | 5/1972 | Rauch, Jr. et al. | 134/2 X |
| 4,154,791 | 5/1979 | Howells et al. | 134/3 X |
| 4,374,744 | 2/1983 | Kawanabe et al. | 252/79.4 |
| 4,424,097 | 1/1984 | Lipka et al. | 156/656 |
| 4,713,144 | 12/1987 | Schiller | 156/656 |
| 4,851,148 | 7/1989 | Yamasoe et al. | 134/3 X |
| 4,921,571 | 5/1990 | Kukanskis et al. | 156/656 |
| 4,944,851 | 7/1990 | Cordani et al. | 204/106 |
| 4,957,653 | 9/1990 | Cordani | 252/142 |
| 4,964,920 | 10/1990 | Jackson et al. | 252/79.4 X |
| 5,017,267 | 5/1991 | Cordani | 156/656 |

Primary Examiner—Thi Dang
Attorney, Agent, or Firm—St. Onge Steward Johnston & Reens

[57] ABSTRACT

A composition for stripping tin, and any underlying copper-tin intermetallic, from a copper surface, the composition being an aqueous solution of sulfuric acid and at least one member selected from an inorganic nitrate, preferably ferric nitrate, and nitric acid, and mixtures thereof.

16 Claims, No Drawings

COMPOSITION AND PROCESS FOR STRIPPING TIN FROM COPPER SURFACES

BACKGROUND OF THE INVENTION

The present invention relates to compositions and methods for the stripping of tin from a copper metal surface, and more particularly to compositions and methods for stripping tin from a copper metal surface in the course of fabricating a printed circuit board.

In the course of fabricating a printed circuit board, it is commonplace to deposit a layer of tin or tin-lead alloy (solder) on all or selected conductive copper surfaces of the board to serve as an etch resist in the subsequent etching away of copper from other areas of the board. In many of these processes, it also is necessary to later strip the tin or tin-lead from all or selected copper surfaces over which it was deposited. This need arises, for example, where it is necessary to plate nickel or gold directly over copper at certain portions of the board (e.g., contact fingers) or where it is desired to apply a solder mask over certain bare copper surfaces (so-called SMOBC processes). Where tin, rather than tin-lead alloy, was used as the etch resist, stripping of the tin from selected copper surfaces is often a necessary step before provision of those surfaces (e.g., through-holes, surrounding pads, surface mount areas) with a solderability-promoting/solderability-preserving coating, such as a solder coating applied by immersion techniques or hot air solder levelling. Oftentimes, it is simply necessary to strip tin or tin-lead from copper in the course of treating a reject piece in an effort to recover and reuse the underlying copper material.

In addition, when copper metal surfaces are coated with tin or tin-lead alloy, a thin layer or film of copper-tin alloy (intermetallic) typically forms at the layer interface, which film progressively increases in thickness with time. Accordingly, in processes designed to strip away tin or tin-lead alloy to expose underlying copper metal, it is necessary to insure that this coppertin intermetallic also is removed.

The art is replete with teachings directed to compositions and processes for stripping tin or tin-lead alloy from copper surfaces. One class of such compositions includes those based upon hydrogen peroxide and hydrofluoric acid or a fluoride; another class involves those employing nitro-substituted aromatic compounds as a principal ingredient, often in conjunction with an inorganic or organic acid; and another class involves nitric acid-based strippers. See, e.g., U.S. Pat. No. 4,374,744 which discloses a tin or tin-lead stripper made up of an inorganic (hydrochloric, sulfuric, nitric) or organic acid, an oxidizing agent (ferric chloride, hydrogen peroxide) and a nitrogen-containing heterocyclic compound; U.S. Pat. No. 4,424,097, which refers in its background to acid strippers for tin or tin-lead, such as fluoboric or nitric acid strippers, and sulfuric acid strippers; and U.S. Pat. No. 4,713,144, which discloses a nitric acid, ferric nitrate, sulfamic acid composition for stripping tin or tin-lead.

Each of these known tin or tin-lead stripping compositions possesses disadvantageous properties or characteristics. U.S. Pat. Nos. 4,957,653 to Cordani; 4,921,571 to Kukanskis et. al.; 4,944,851 to Cordani et. al.; and 5,017,267 to Cordani, each of which is expressly incorporated herein by reference, contain discussion of these prior art compositions and their disadvantages, and then go on to disclose highly useful and efficient strippers for tin or tin-lead which are based upon solutions of alkane sulfonic acid and ferric nitrate, and which may also include nitric acid, a source of chlorate ion, an inhibitor, and the like.

As reflected in the foregoing and other patents, the general trend in the industry has been to provide a single composition capable of stripping both tin and tin-lead, and which thus can be employed irrespective of whether it is tin or tin-lead which has been used in the printed circuit fabrication process and needs to be stripped. As a consequence, the compositions must contain components effective to oxidize and solubilize both tin and lead ions, and must be sufficiently aggressive to strip tin-lead (and, accordingly, must be properly inhibited against extensive attack of the underlying copper surface). The result typically is a high cost formulation. For those fabricators who make extensive use of tin, and who thus require only a tin stripper, this high cost is a distinct disadvantage.

SUMMARY OF THE INVENTION

It is a primary object of the invention to provide an effective, yet low-cost, formulation for the stripping of tin, as well as copper-tin intermetallic, from a copper metal surface, and to provide a process for carrying out the stripping.

According to the invention, this object is achieved by the provision of a tin stripping composition which is an aqueous solution consisting essentially of sulfuric acid and at least one member selected from nitric acid and an inorganic nitrate.

In the most preferred embodiment of the invention, both nitric acid and inorganic nitrate (most preferably, ferric nitrate) will be present in the solution, and there additionally will be present an inhibitor for minimizing attack of the underlying copper metal surface.

A distinct advantage of the tin stripping composition of the invention is that it is a very low cost formulation relative to the most useful tin/tin-lead stripper presently available, i.e., the alkane sulfonic acid/ferric nitrate formulations of the earlier noted patents, primarily because sulfuric acid is about 20-times less expensive than, e.g., methane sulfonic acid based upon current market prices. Most unexpectedly, however, this low cost formulation provides, for tin stripping, all the desirable attributes of these prior more expensive formulations, such as rapid and efficient stripping of tin and copper-tin intermetallic in a single step; no appreciable formation of sludge or precipitate; and ease of waste treatment.

DETAILED DESCRIPTION OF THE INVENTION

As previously noted, the composition of the present invention is particularly useful in the environment of printed circuit fabrication methods, in which copper circuitry on an insulating substrate has been provided with a layer of tin incident to the fabrication method, but which then is required to be removed from the copper as a further step in the fabrication sequence. When used as an etch resist, for example, the tin layer (deposited electrolytically, electrolessly or by immersion exchange/ replacement reaction) typically will have a thickness on the order of from about 0.0002 to 0.0004 inches (0.2 to 0.4 mils). In such processes, a thin layer or film of copper-tin intermetallic also will form at the interface of the copper and tin layers, generally having a thickness of about 0.002 to 0.004 mils, which thickness increases with time.

In such processes, it is essential that the stripping remove tin and copper-tin intermetallic so as to expose underlying copper metal, but at the same time not attack the copper metal itself.

In the composition of the invention, sulfuric acid will be present in the aqueous solution in a concentration, based on sulfuric acid per se, of from about 10 g/l to about 800 g/l more preferably from about 100 g/l to about 400 g/l and most preferably from about 150 g/l to about 250 g/l.

The other essential component of the composition is at least one of an inorganic nitrate and nitric acid, with both being present in the most preferred compositions.

The inorganic nitrate can be any suitable and available compound, such as ferric nitrate, sodium nitrate, ammonium nitrate or the like, or mixtures thereof, with ferric nitrate being most preferred. Whether used alone or with nitric acid, the inorganic nitrate typically will be present in the aqueous solution in a concentration of from about 1 to about 300 g/l more preferably a concentration of from about 5 to about 150 g/l and most preferably a concentration of from about 20 to about 90 g/l. When nitric acid is included in the aqueous solution along with the inorganic nitrate, the concentration of the inorganic nitrate generally can be chosen toward the lower ends of these ranges, while concentrations in the higher ends of these ranges will typically be employed when nitric acid is not included in the composition.

The foregoing ranges are given with reference to the inorganic nitrate per se, but it generally will be the case that the most readily available commercial form for some of the inorganic nitrates for use in making up the aqueous solution will be as a solution thereof (e.g., 45% by weight anhydrous ferric nitrate).

The same concentration ranges given for the inorganic nitrate also are applicable to the nitric acid concentration in the aqueous solution of the invention, and again with concentrations towards the higher ends of the ranges for solutions which do not include an inorganic nitrate and concentrations towards the lower ends of the ranges for solutions where both nitric acid and inorganic nitrate will be included. Again, the concentrations are given for nitric acid per se, but a typical form thereof for make-up of the solution will be the commercially readily available 69-70% by weight nitric acid solutions.

In the preferred embodiments of the invention, both nitric acid and an inorganic nitrate (or mixtures of inorganic nitrates) will be included along with sulfuric acid in the aqueous solution. In these compositions, preferred concentrations will be from about 100 to 400 g/l sulfuric acid, from about 15 to about 90 g/l inorganic nitrate, and from about 25 to about 150 g/l nitric acid. Still more preferred are solutions in which the sulfuric acid is present at from 150 to 250 g/l the inorganic nitrate present at from 20 to 50 g/l and the nitric acid present at from 35 to 100 g/l.

The most preferred compositions also will contain an inhibitor of the type which minimizes attack of the underlying copper surface, but which at the same time does not appreciably affect the essential characteristics of the stripper, i.e., stripping ability, stripping time, substantial absence of sludge or precipitate, and the like. Among the useful inhibitors for this purpose are those set forth in the earlier-mentioned U.S. Pat. No. 4,921,571 to Kukanskis et. al. for an alkane sulfonic acid/inorganic nitrate system for stripping tin or tin-lead from copper, the disclosure of which is incorporated herein by reference.

For employing the aqueous solutions to treat tin-coated copper surfaces to remove the tin, and any copper-tin intermetallic, therefrom so as to expose the copper metal, the surfaces in question are either immersed in the solution or the solution is sprayed on the surfaces. For typical tin and copper-tin thicknesses as earlier described, complete removal generally can be effected in 30 seconds to 2 minutes via immersion, and somewhat faster for spraying processes. In either case, of course, the composition can be used to treat a multitude of tin-coated copper surfaces simultaneously and/or sequentially until it has become exhausted to the point where stripping efficiency becomes uneconomically low.

The tin stripping composition of the invention can be employed at room temperature, but preferred operation involves temperatures of from about 80° F. to about 150° F.

The invention is further described with reference to the following examples.

EXAMPLE I

An aqueous solution was prepared containing 185 g/l sulfuric acid, 55 g/l of 70 weight percent nitric acid solution, 105 g/l of 45 weight percent ferric nitrate solution, and 0.1 g/l of an inhibitor.

The solution was heated to 90° F. and used to strip tin from copper panels coated with 0.2 mils of tin. The panels immersed in the solution were stripped down to clean copper metal in generally less than one minute. The solution was used to strip additional panels until such time as the stripping time exceeded 2 minutes. At that sage, the solution container about 100 g/l of dissolved tin metal, with no sludge or precipitate evident. Attack of underlying copper was very low, on the order of about 10 microinches per minute.

EXAMPLE II

An aqueous solution was prepared containing 225 g/l sulfuric acid, 100 g/l of 70% nitric acid, 80 g/l of 45% ferric nitrate and 0.1 g/l of an inhibitor.

The solution was heated to 90° F. and used to strip tin from copper panes coated with 0.2 mils of tin. The panels immersed in the solution were stripped down to clean copper metal in generally less than one minute. The solution was used to strip additional panels until such time as the stripping time exceeded 2 minutes. At that stage, the solution container about 105 g/l of dissolved tin metal, with no sludge or precipitate evident. Attach of the underlying copper was very low, on the order of about 10 microinches per minute.

EXAMPLE III

An aqueous solution was prepared containing 200 g/l sulfuric acid, 150 g/l of 70% nitric acid, 10 g/l of ammonium nitrate, and 0.1 g/l of an inhibitor.

Tin plated (0.2 mils) copper panels were stripped at 90° F. as in the previous examples. The solution reached a capacity of about 90 g/l dissolved tin, with no sludge or precipitate. The corresponding copper attack was low.

EXAMPLE IV

An aqueous solution was prepared containing 200 g/l sulfuric acid, 180 g/l of 45% ferric nitrate and 0.1 g/l of an inhibitor.

Tin plated (0.2 mils) copper panels were stripped at 100° F. as in the previous examples. The solution reached a capacity of about 75 g/l dissolved tin, with no sludge or precipitate. The corresponding copper attack was low.

Although the invention has been described with reference to particular features and embodiments, it will be understood that these are not intended as limitations of the scope of the invention except to the extent recited in the appended claims.

What is claimed is:

1. A method for stripping tin, and any underlying copper-tin intermetallic, from a copper surface, without bringing about any significant formation of sludge or precipitate, said method comprising contacting said surface with a composition comprising an aqueous solution consisting essentially of sulfuric acid and a member selected from the group consisting of inorganic nitrate, nitric acid and combinations thereof, each in amounts effective to strip said tin, and any underlying copper-tin intermetallic, from said copper surface without bringing about significant formation to sludge or precipitate, for a time effective to strip said tin, and any underlying copper-tin intermetallic, from said copper surface.

2. A method according to claim 1 wherein said aqueous solution consists essentially of sulfuric acid and inorganic nitrite.

3. A method according to claim 1 wherein said aqueous solution consists essentially of sulfuric acid and nitric acid.

4. A method according to claim 1 wherein said aqueous solution consists essentially of sulfuric acid, ferric nitrate and nitric acid.

5. A method according to claim 4 wherein said aqueous solution contains from about 100 to about 400 g/l of sulfuric acid; from about 15 to about 90 g/l of inorganic nitrate; and from about 25 to about 150 g/l of nitric acid.

6. A method according to claim 5 wherein said inorganic nitrate is ferric nitrate.

7. A method according to claim 5 wherein said aqueous solution further consists essentially of an inhibitor effective to minimize attack of the copper surface while not substantially slowing the speed of stripping of said tin, and any underlying copper-tin intermetallic, as compared to that obtained without said inhibitor.

8. A method according to claim 1 wherein said contacting is selected from the group consisting of immersing said surface in said solution and spraying said solution on said surface.

9. A method according to claim 1 wherein said copper surface is present as a conductive area of a printed circuit board.

10. A composition for stripping tin, and any underlying copper-tin intermetallic, from a copper surface, without bringing about significant formation of sludge or precipitate, said composition comprising an aqueous solution consisting essentially of sulfuric acid, and a member selected from the group consisting of inorganic nitrate, nitric acid and combinations thereof, each in amounts effective to strip said tin, and any underlying copper-tin intermetallic, from said copper surface, without significant formation of sludge or precipitate, and further consisting essentially of an inhibitor effective to minimize attach of the copper surface while not substantially slowing the speed of stripping of said tin, and any underlying copper-tin intermetallic, as compared to that obtained without said inhibitor.

11. A composition according to claim 10 wherein said aqueous solution consists essentially of sulfuric acid, inorganic nitrate and said inhibitor.

12. A composition according to claim 10 wherein said aqueous solution consists essentially of sulfuric acid, nitric acid and said inhibitor.

13. A composition according to claim 10 where said aqueous solution consists essentially of sulfuric acid, inorganic nitrate, nitric acid and said inhibitor.

14. A composition according to claim 13 wherein said aqueous solution contains from about 100 to about 400 g/l aqueous solution contains from about 100 to about 400 g/l of sulfuric acid; from about 15 to about 90 g/l of inorganic nitrate; and from about 25 to about 150 g/l of nitric acid.

15. A composition according to claim 13 wherein said inorganic nitrate is ferric nitrate.

16. A composition for stripping tin, and any underlying copper-tin intermetallic, from a copper surface, without bringing about significant formation of sludge or precipitate, said composition comprising an aqueous solution consisting essentially of from about 100 to about 400 g/l sulfuric acid, from about 15 to about 90 g/l ferric nitrate, from about 25 to about 150 g/l nitric acid, and an inhibitor effective to minimize attack of the copper surface while not substantially slowing the speed of stripping of said tin, and any underlying copper-tin intermetallic, as compared as to that obtained without said inhibitor.

* * * * *